United States Patent
Schulz

(10) Patent No.: US 9,712,186 B1
(45) Date of Patent: Jul. 18, 2017

(54) SERIAL MEMORY INTERFACE CIRCUITRY FOR PROGRAMMABLE INTEGRATED CIRCUITS

(71) Applicant: Altera Corporation, San Jose, CA (US)

(72) Inventor: Jeffrey Schulz, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 292 days.

(21) Appl. No.: 14/256,407

(22) Filed: Apr. 18, 2014

(51) Int. Cl.
*H04L 1/18* (2006.01)
*H03M 13/09* (2006.01)

(52) U.S. Cl.
CPC .................. *H03M 13/093* (2013.01)

(58) Field of Classification Search
CPC .................................................. H03M 13/093
See application file for complete search history.

(56) References Cited

U.S. PATENT DOCUMENTS

| | | | |
|---|---|---|---|
| 6,026,481 A | 2/2000 | New et al. | |
| 6,096,091 A | 8/2000 | Hartmann | |
| 7,363,573 B1 * | 4/2008 | Bataineh | H03M 13/09 714/758 |
| 7,801,121 B1 * | 9/2010 | Van Wageningen | H04Q 11/04 370/242 |
| 8,279,892 B2 | 10/2012 | Denney et al. | |
| 8,555,116 B1 | 10/2013 | Shaeffer et al. | |
| 9,092,305 B1 * | 7/2015 | Blott | G06F 12/00 |

OTHER PUBLICATIONS

"Hybrid Memory Cube Specification 1.0," Hybrid Memory Cube Consortium, 2013 [Retrieved on Apr. 18, 2014]. Retrieved from the Internet <URL:http://hybridmemorycube.org/files/SiteDownloads/HMC_Specification%201_0.pdf>.

* cited by examiner

*Primary Examiner* — Sam Rizk
(74) *Attorney, Agent, or Firm* — Michael H. Lyons; Tianyi He

(57) ABSTRACT

A programmable integrated circuit may be provided with a memory interface for communicating with an external memory over a serial communications path. To accommodate a variety of different memory interface protocols while satisfying low-latency performance criteria, part of the memory interface may be formed from programmable logic and part of the memory interface may be formed from hardwired circuitry. The programmable logic of the memory interface may be used to implement packet formation logic that creates packets that include empty fields for sequence number information, acknowledgement information, and cyclic redundancy check information. The hardwired circuitry of the memory interface may be used to insert a sequence number, an acknowledgement, and cyclic redundancy check information into the empty fields.

25 Claims, 10 Drawing Sheets

| Name | Field Label |
|---|---|
| Tag | TAG |
| Cyclic redundancycheck | CRC |
| Sequence number | SEQ |
| Forward retry pointer | FRP |
| Return retry pointer | RRP |

FIG. 8

| 63:56 | 55:48 | 47:40 | 39:32 | 31:24 | 23:16 | 15:8 | 7:0 | comments |
|---|---|---|---|---|---|---|---|---|
| [cube][reserved][2 bits adr] | adr | adr | adr | adr | Empty | DLN/Plen | CMD | Header |
| data | data | data | data | data | data | data | data | Data |
| Data | Data | Data | Data | Data | Data | Data | Data | Data |
| Empty | Empty | Empty | Empty | SLID/Res | Empty | Empty | Empty | tail |

FIG. 9

SERIAL MEMORY INTERFACE CIRCUITRY FOR PROGRAMMABLE INTEGRATED CIRCUITS

BACKGROUND

This invention relates to integrated circuits such as programmable integrated circuits, and more particularly, to serial memory interfaces for programmable integrated circuits.

Programmable integrated circuits such as field programmable gate arrays and other programmable logic devices are integrated circuits that can be programmed by a user to implement a desired custom logic function. In a typical scenario, a logic designer uses computer-aided design tools to design a custom logic circuit. When the design process is complete, the tools generate configuration data files. The configuration data is loaded into memory elements on the programmable integrated circuits to configure the programmable integrated circuits to perform the desired custom logic function.

Programmable integrated circuits may be coupled to external memory such as random-access memory. To support high memory bandwidth, an integrated circuit and associated memory may be provided with serial memory interfaces. The serial memory interfaces may be used to send and receive data packets over a serial communications path between the integrated circuit and the associated memory.

Challenges can arise when providing a programmable integrated circuit with a serial memory interface. Different memories may support different serial memory interface protocols. It would be desirable to be able to support multiple serial memory interface protocols to maximize compatibility with these different types of memory.

Latency is also a concern. To ensure successful transmission of data across a serial path between an integrated circuit and a memory, each successfully received packet is acknowledged by sending a corresponding acknowledgement over the serial path. Retransmission buffers are used to store transmitted packets until acknowledgement of successful transmission is received. Memories typically do not include large retransmission buffers. Particularly in environments in which retransmission buffer size is limited, link performance can be significantly reduced in the presence of acknowledgement processing latency, so there is a desire to minimize acknowledgement processing latency.

It would be desirable to be able to provide serial memory interface circuitry for programmable integrated circuits that can address these concerns.

SUMMARY

A programmable integrated circuit may be provided with a memory interface for communicating with an external memory over a serial communications path. To accommodate a variety of different memory interface protocols while satisfying performance criteria, part of the memory interface may be formed from programmable logic and part of the memory interface may be formed from hardwired logic circuitry.

During design and programming operations, a memory interface protocol may be selected and a programmable integrated circuit may be programmed to create user logic and a soft memory controller with packet formation logic. The soft memory controller may serve as an interface between the user logic and the hardwired circuitry of the memory interface.

Outgoing packets may be created by the packet formation logic based on information from the user logic. The packet formation logic may incorporate empty fields into the outgoing packets. The empty fields may include an empty sequence number field, an empty acknowledgment field, and an empty cyclic redundancy check field.

The hardwired memory interface circuitry may include a cyclic redundancy check checking circuit that checks incoming packets from the memory for errors. If an incoming packet is identified as being free of errors, a hardwired sequence number extractor may extract a sequence number from the incoming packet. Substitution logic in the hardwired memory interface circuit may create a packet acknowledgement based on the received sequence number and may substitute this acknowledgement into the empty acknowledgment field of the outgoing packet. The substitution logic may also insert a sequence number into the empty sequence number field. A cyclic redundancy check generator in the hardwired memory interface circuitry may compute a cyclic redundancy check value for the outgoing packet and may insert the cyclic redundancy check value into the empty cyclic redundancy check field.

The hardwired memory interface circuitry may include a retransmission buffer. The retransmission buffer may provide sequence number information such as memory addresses for stored packets to the substitution logic to use in forming the sequence numbers. The retransmission buffer may receive information on received acknowledgements from the sequence number extractor and may clear stored data packets based on the received acknowledgements.

Further features of the invention, its nature and various advantages will be more apparent from the accompanying drawings and the following detailed description of the preferred embodiments.

BRIEF DESCRIPTION OF THE DRAWINGS

FIG. 8 is a table of illustrative packet field labels of the type that may be inserted into a packet using hard logic when operating a memory in accordance with an illustrative serial memory protocol in accordance with an embodiment of the present invention.

FIG. 9 is a diagram of an illustrative packet with blank spaces that has been formed by soft packet formation logic in accordance with an embodiment of the present invention.

DETAILED DESCRIPTION

Figure 1:
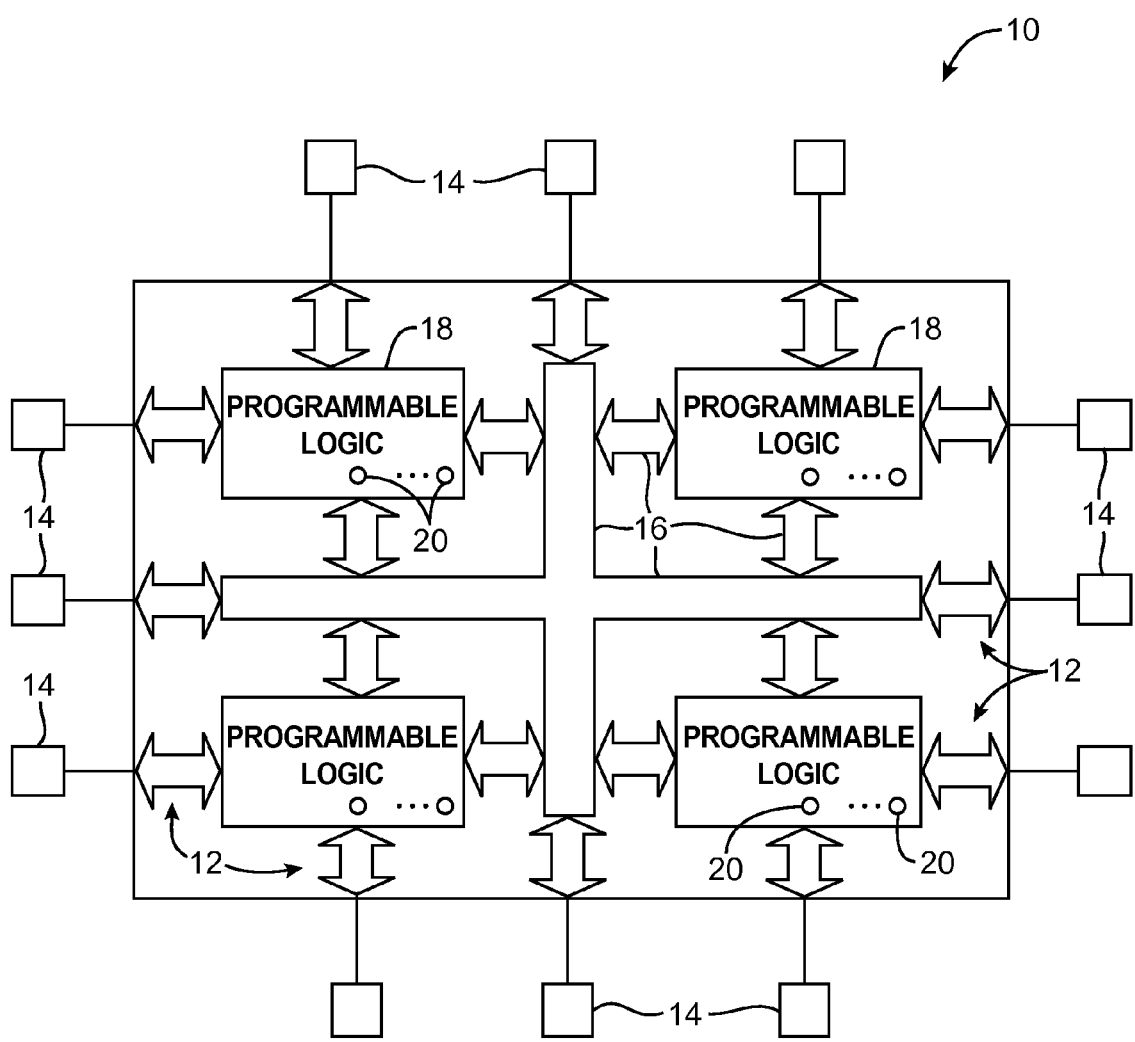
FIG. 1 is a diagram of an illustrative programmable integrated circuit of the type that may be provided with memory interface circuitry in accordance with an embodiment of the present invention.

An illustrative programmable integrated circuit of the type that may be provided with memory interface circuitry for supporting communications with external memory is shown in FIG. 1. Programmable integrated circuit 10 may have input/output circuitry 12 for driving signals off of programmable integrated circuit 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. Programmable logic 18 may be configured to perform a custom logic function (sometimes referred to as user logic). The programmable interconnects associated with interconnection resources may be considered to be a part of programmable logic 18.

Programmable integrated circuit 10 contains programmable elements 20. Programmable elements 20 may be based on any suitable technology. For example, programmable elements may be formed from mask-programmable via structures on device 10. With this type of arrangement, the programmable logic of programmable integrated circuit 10 is configured using custom photolithographic masks during fabrication. As another example, programmable elements 20 may be formed from volatile memory elements. Programmable elements 20 can also be formed from non-volatile memory elements such as fuses, antifuses, electrically-programmable read-only memory elements, etc. With one suitable arrangement, which is sometimes described herein as an example, programmable elements 20 are formed from random-access memory (RAM) cells.

Memory elements 20 such as RAM-based memory cells may be loaded with configuration data (also called programming data) using pins 14 and input/output circuitry 12. Once loaded, the memory elements each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers and logic array blocks (LABs) and p-channel metal-oxide-semiconductor transistors.

The memory element output signals turn the transistors to which they are connected on and off and thereby configure programmable logic 18 to perform its desired logic function. When a memory element supplies a high output to an NMOS pass transistor (as an example), the transistor is turned on and passes logic signals from its input to its output. When the memory element output is low, the pass transistor is turned off and does not pass logic signals. Being able to configure pass transistors in this way allows the logic of the programmable integrated circuit to be programmed to implement a desired logic design.

Because memory elements 20 store configuration data, the memory elements are sometimes referred to as configuration random-access-memory (CRAM) cells. Other terms that are sometimes used to refer to memory elements 20 include terms such as memory cells, static random-access-memory elements or cells, RAM cells, RAM elements, CRAM cells, configuration elements, volatile memory elements, configuration bits, etc. Programmable integrated circuit 10 may, as an example, have millions of memory elements 20. Programmable integrated circuits with fewer memory elements or more memory elements may also be provided with memory interface circuitry for communicating with external memory if desired.

The circuitry of programmable integrated circuit 10 may be organized using any suitable architecture. As an example, the logic of programmable integrated circuit 10 may be organized in a series of rows and columns of larger programmable logic regions each of which contains multiple smaller logic regions. The logic resources of programmable integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of programmable integrated circuit 10 may be arranged in more levels or layers in which multiple large regions are interconnected to form still larger portions of logic. Still other programmable integrated circuit arrangements may use logic that is not arranged in rows and columns.

Figure 2:
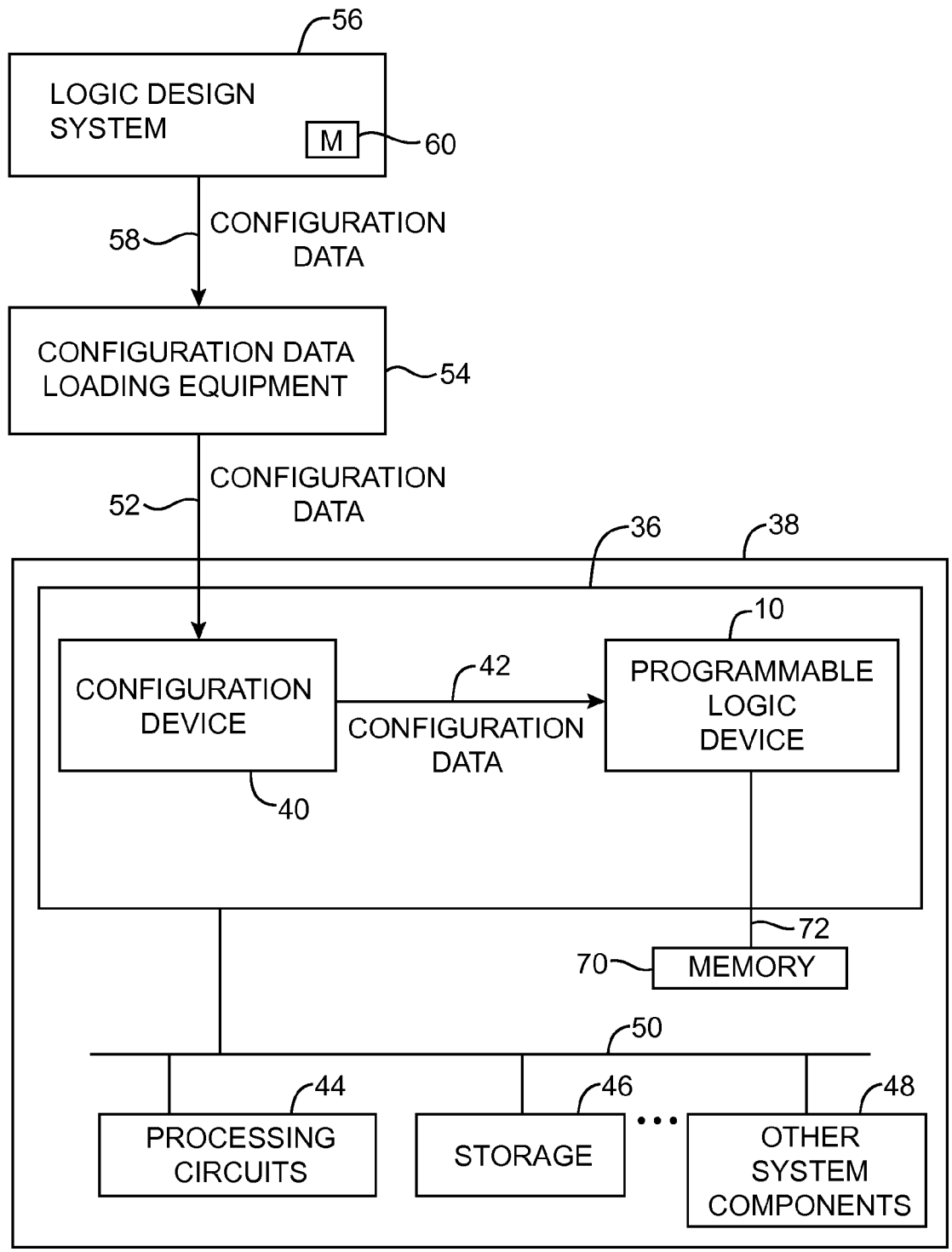
FIG. 2 is a diagram showing how programmable integrated circuit configuration data may be created by a logic design system and loaded into a programmable integrated circuit to configure the programmable integrated circuit for operation in a system in accordance with an embodiment of the present invention.

An illustrative system environment for programmable integrated circuit 10 is shown in FIG. 2. Programmable integrated circuit 10 may be mounted on printed circuit board 36 in system 38. In general, programmable integrated circuit 10 may receive programming data from programming equipment or from any other suitable equipment or device. In the example of FIG. 2, programmable integrated circuit 10 is the type of programmable integrated circuit that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable integrated circuit configuration data loading chip with built-in memory (sometimes referred to as a configuration device), or any other suitable device. When system 38 boots up (or at another suitable time), the configuration data for configuring the programmable integrated circuit may be supplied to the programmable integrated circuit from device 40, as shown schematically by path 42. The configuration data that is supplied to the programmable integrated circuit may be stored in the programmable integrated circuit in its configuration random-access-memory elements 20.

System 38 may include processing circuits 44, storage 46, and other system components 48 that communicate with device 10. As shown in FIG. 2, programmable integrated circuit 10 may be coupled to external memory 70 (e.g., random-access memory) using serial communications path 72. Serial communications path may contain multiple lanes (i.e., multiple serial links). Bonding circuitry may be included in the memory interfaces of programmable integrated circuit 10 and memory 70 to distribute packets across multiple lanes and, on the receiving circuit, to bond together the received data. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40.

It can be a significant undertaking to design and implement a desired logic circuit in a programmable integrated circuit. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable integrated circuit.

As shown in FIG. 2, the configuration data produced by a logic design system 56 may be provided to equipment 54 over a path such as path 58. Equipment 54 provides the configuration data to device 40, so that device 40 can later provide this configuration data to the programmable integrated circuit 10 over path 42. Arrangements in which a path such as path 52 is coupled directly to programmable integrated circuit 10 for loading configuration data into programmable integrated circuit 10 without initially loading the data into device 40 may also be used if desired.

Logic circuit design system 56 includes processing circuitry and storage 60. In supporting design operations involved in implementing a desired custom logic function, logic design system 56 uses computer aided design software that runs on circuitry and storage 60.

Figure 3:
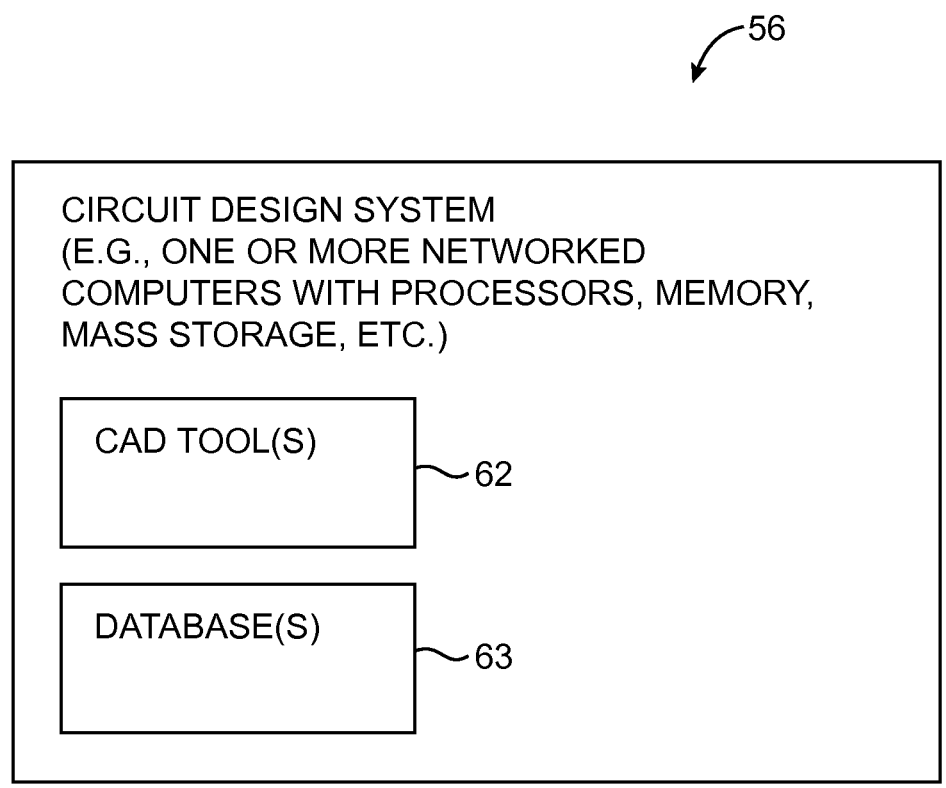
FIG. 3 is a diagram of a circuit design system that may be used to generate configuration data for implementing custom circuit designs in programmable integrated circuits in accordance with an embodiment of the present invention.

An illustrative circuit design system 56 is shown in FIG. 3. System 56 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 62 and databases 63 reside on system 56. During operation, executable software such as the software of computer aided design tools 62 runs on the processor(s) of system 56. Databases 63 are used to store data for the operation of system 56. In general, software and data may be stored on any computer-readable medium (storage) in system 56. Such storage, which is shown schematically as storage 60 of FIG. 2, may include computer memory chips, removable and fixed media such as hard disk drives, flash memory, compact discs (CDs), DVDs, other optical media, tapes, or any other suitable memory or storage device(s). When the software of system 56 is installed, the storage 60 of system 56 has instructions and data that cause the computing equipment in system 56 to execute various methods (processes).

Computer aided design (CAD) tools 62, some or all of which are sometimes referred to collectively as a CAD tool, may include one or more suites of tools (e.g., a compiler suite for performing tasks associated with implementing a circuit design in a programmable logic device) and/or as one or more separate software components (tools). Database(s) 63 may include one or more databases that are accessed only by a particular tool or tools and may include one or more shared databases.

Programmable integrated circuit 10 includes memory interface circuitry. The memory interface circuitry supports communications with external memory 70 over serial communications path 72. Different types of external memory may use different corresponding protocols. For example, a first type of memory may require a first memory interface protocol that uses a first data packet format, whereas a second type of memory may require the use of a second memory interface protocol that uses a second data packet format. The first and second data packet formats may be different. For example, fields such as a sequence number field, an acknowledgement field, and a cyclic redundancy check (CRC) field may be at different bit locations.

Figure 4:
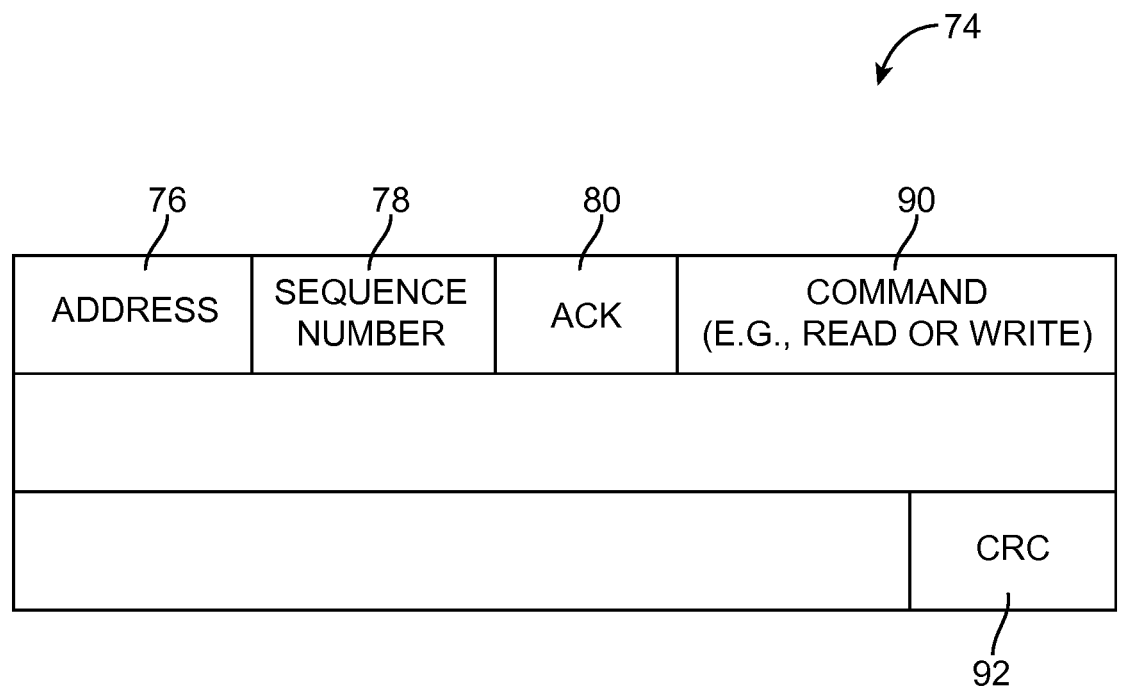
FIG. 4 is a diagram of an illustrative data packet of the type that may be used in conveying information over a serial communications path between a programmable integrated circuit and an external memory in accordance with an embodiment of the present invention.

An illustrative data packet is shown in FIG. 4. As shown in FIG. 4, data packet 74 may include fields such as address field 76, sequence number field 78, acknowledgement field 80, command field 90, and CRC field 92. Data packet 74 may also contain a data payload (e.g., data to be written to external memory or data that has been read from external memory).

To accommodate multiple memory interface protocols while maintaining satisfactory packet processing performance, the memory interface circuitry of programmable logic device 10 may be implemented partly in programmable logic 18 and partly in hardwired logic. Hardwired logic is fabricated using photolithographic processing rather than being customized by loading configuration data into configuration memory elements 20 in programmable logic 18. Hardwired logic may be formed exclusively using non-programmable logic or may, if desired, be provided in a partly hardened configuration. In a partly hardwired configuration, a hardwired circuit can be placed in different modes of operation in response to control signals. As an example, a hardened logic resource such as a first-in-first-out (FIFO) buffer may be configurable to have a first buffer depth when operated in a first mode and to have a second buffer depth when operated in a second mode. Control signals for adjusting the buffer depth (in this example) or for adjusting the hardwired logic to perform other desired predefined functions can be generated by user logic (logic associated with a user design that is implemented in programmable logic) and/or can be received from external source(s) via input-output pins 14. In general, hardened logic (whether purely hardwired or hardened to the extent that control signals can be used to place the hard logic into different modes of operation) includes circuitry with more dedicated functionality than that of general purpose programmable logic resources (e.g., collections of logic elements and other regions of general purpose logic that is configured by loading configuration memory with programming bits).

Low latency may be assured by performing tasks such as sequence number processing, acknowledgement (ACK) processing, and CRC processing in the hardwired circuitry of the memory interface (e.g., completely hardened circuitry or partly hardened circuitry that is operable to implement one or more selected predefined functions in response to control signals from user logic or external control signals).

Hardwired memory interface circuitry may include substitution circuitry for substituting an appropriate sequence number and ACK into each outgoing data packet such as packet 74. Programmable logic 18 may be used in implementing a packet formatter (sometimes referred to as packet formation logic) that handles data packet parsing operations and handles the passing of data packets to and from user logic (i.e., a user-defined customer logic circuit) in programmable logic 18. When transmitting data packets, the packet formation logic may leave blank regions (e.g., bits that contain only zeros that are effectively empty). The hardwired substitution circuitry may insert (by substitution) a sequence number and ACK into blank sequence number and ACK regions. Hardwired CRC generator circuitry may then compute a CRC value and add it to the packet in the CRC field.

Figure 5:
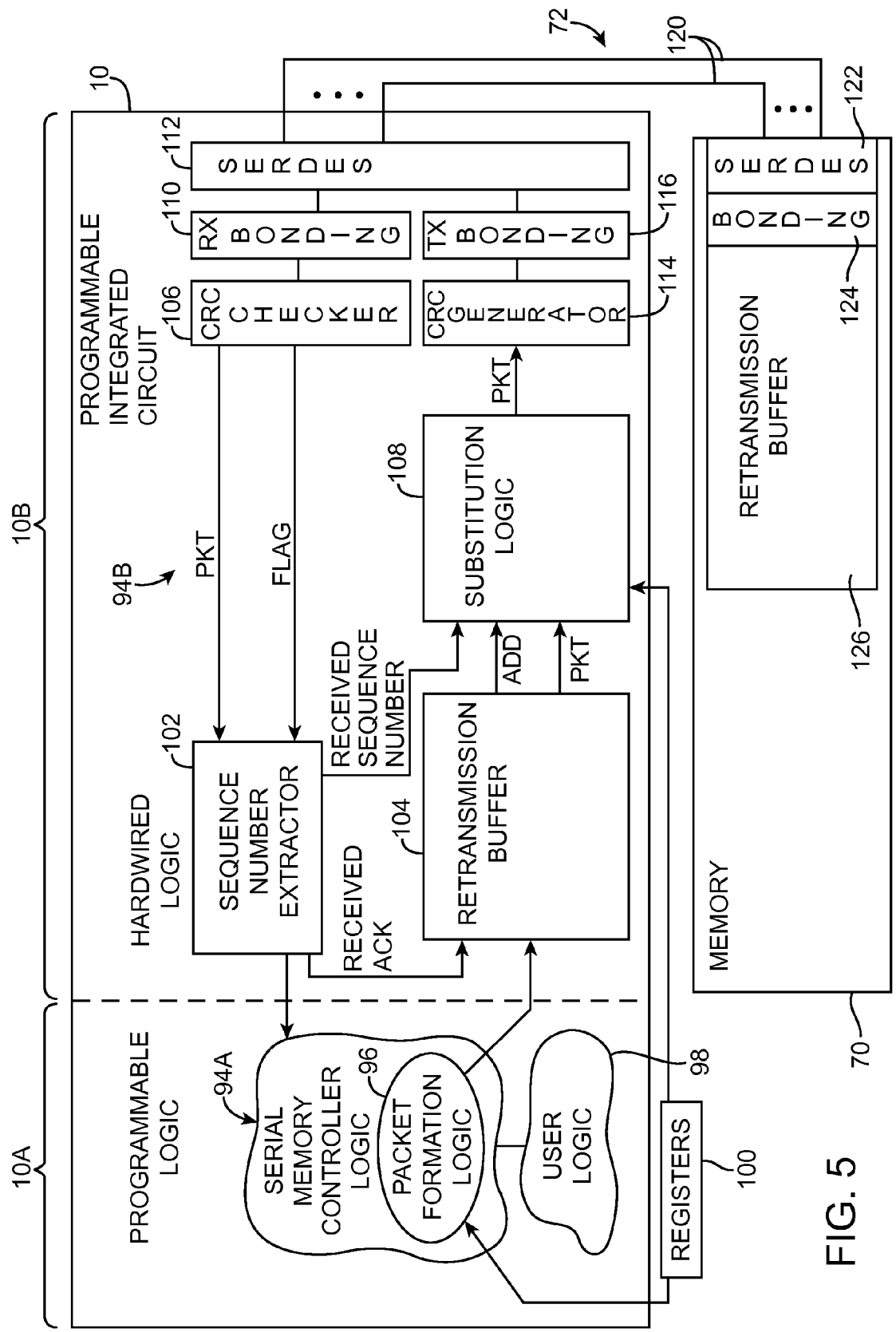
FIG. 5 is a circuit diagram of an external memory coupled to an illustrative programmable integrated circuit with memory interface circuitry in accordance with an embodiment of the present invention.

FIG. 5 shows how programmable integrated circuit 10 may be coupled to external memory 70 via serial communications path 72. Serial communications path 72 may contain multiple lanes 120.

Memory 70 and programmable interface circuitry 10 may each contain memory interface circuitry for supporting communications over path 72. For example, memory 70 may include retransmission buffer 126 for storing transmitted data packets while awaiting acknowledgment from programmable integrated circuit 10. Serializer-deserializer (SERDES) circuit 122 may be used to transmit and receive signals conveyed over lanes 120 of path 72. Bonding circuitry 124 may be used in combining the data from multiple lanes into a single stream of data (and in allocating data to different lanes during transmission). Memory 70 has a retransmission buffer such as retransmission buffer 126 that is coupled to bonding circuitry 124.

The serial communications scheme that is used to support communications between programmable integrated circuit 10 and memory 70 may use sequence numbers and acknowledgements (ACKs). Each transmitted data packet may be labeled (tagged) with a corresponding sequence number. This sequence number may correspond to a particular address in a retransmission buffer where the transmitted data packet is stored pending receipt of an acknowledgement from the receiving circuit. On the receiving end of the link, incoming data packets are error checked. If no errors are detected (i.e., if the packet is error free), the receiving circuit sends an ACK back to the transmitting circuit. The ACK is based on the sequence number of the successfully received data packet. When the ACK is received by the transmitting circuit, the transmitting circuit can conclude that the data packet has been successfully conveyed over the serial path and can therefore remove the stored copy of the data packet from the retransmission buffer.

Programmable integrated circuit 10 has memory interface circuitry 94A that is implemented in programmable logic 18 and hardwired memory interface circuitry 94B. Memory interface circuitry 94A may sometimes be referred to as soft memory interface circuitry 94A. Memory interface circuitry 94B may sometimes be referred to as being implemented in hard logic.

Programmable logic 18 on programmable integrated circuit 10 may be programmed with configuration data to implement a user's custom circuit design (i.e., user logic 98).

Soft memory interface circuitry 94A in programmable logic 18 may include packet formation logic 96. Packet formation logic 96 may serve as an interface between user logic 98 and hardwired memory interface circuitry 94B. Packet formation logic 96 (sometimes referred to as packet formatter logic or a packet formatter) may handle operations such as packet reordering and packet combining. For example, packet formation logic 96 may reorder incoming packets into an order that matches the order of issued read requests and may combine responses to multiple read requests (e.g., if a user read was sufficiently large to necessitate breaking the read into multiple smaller read requests to satisfy RAM size limitations).

As with memory 70, programmable integrated circuit 10 has serializer-deserializer circuitry (SERDES circuitry 112), lane bonding circuitry 110 (e.g., RX bonding circuitry 110 and TX bonding circuitry 116). On the incoming data packet path, CRC checker 106 is used to error check the incoming data packet from memory 70. Each received packet is provided to sequence number extractor circuit 102. If an incoming packet is error free, CRC checker 106 may assert a flag (FLAG) to inform sequence number extractor 102 that the packet has been successfully received. In response, sequence number extractor 102 may extract the sequence number from the incoming packet and may provide the extracted sequence number to substitution logic 108 to use in forming an acknowledgement ACK that will be included on the next outgoing packet.

Sequence number extractor 102 may provide the successfully received packet to soft serial memory interface circuitry 94A so that packet formation logic 96 may parse the packet for user logic 98. Sequence number extractor 102 may also extract an ACK from the incoming packet and may provide the ACK to retransmission buffer 104 so that retransmission buffer 104 may clear a corresponding previously stored outgoing packet.

In formatting a packet for transmission, packet formation logic 96 may create a packet that contains data from user 98 and that includes empty sequence number, ACK, and CRC fields. The outgoing packet with the empty fields may be provided to retransmission buffer 104. Retransmission buffer 104 may retain a copy of the outgoing packet while awaiting receipt of an ACK from memory 70.

Retransmission buffer 104 may provide address ADD and the packet with the empty fields to substitution logic circuit 108. Address ADD corresponds to the location at which retransmission buffer 104 stored the outgoing packet and serves as sequence number information for insertion into the outgoing packet. Substitution logic 108 may create and substitute a corresponding sequence number for the outgoing packet into the outgoing packet in the empty sequence number field. Substitution logic 108 may also insert the received sequence number from sequence number extractor 102 in the empty ACK field as an ACK. The outgoing packet containing the sequence number and ACK is then provided to CRC generator 114, which computes a CRC for the outgoing packet and places it in the empty CRC field.

The locations of the fields for sequence number, ACK, and CRC differ between different packet formats. Accordingly, this protocol-specific information may be stored in registers 100 or other storage in programmable integrate circuit 10. Registers 100 may, as an example, be implemented from programmable logic (e.g., CRAM 20). The field location information from registers 100 may, if desired, be used by packet formation logic 96 in determining the locations in the outgoing packets where empty fields are to be created and may be used by substitution logic 108 and CRC generator 115 in determining where to insert the sequence number, ACK, and CRC.

Figure 6:
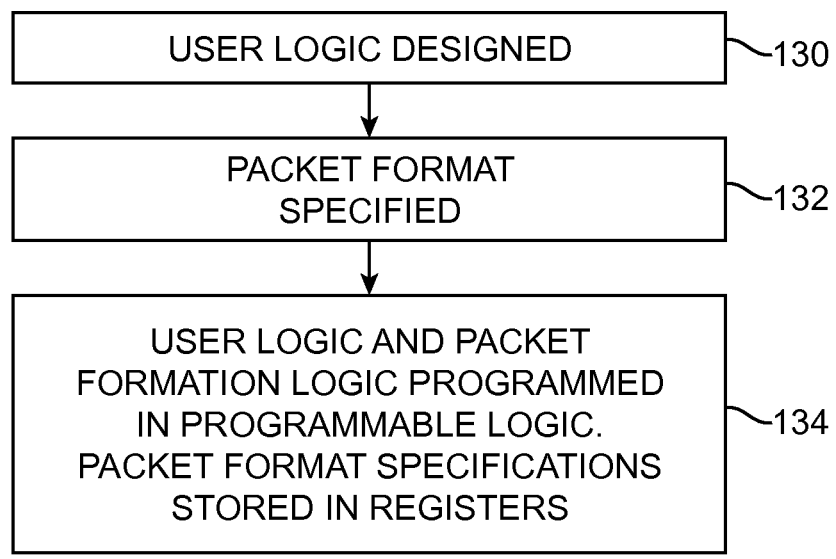
FIG. 6 is a flow chart of illustrative steps involved in implementing a custom circuit and packet formation logic in programmable logic on a programmable integrated circuit in accordance with an embodiment of the present invention.

FIG. 6 is a flow chart of illustrative steps involved in programming programmable integrated circuit 10.

At step 130, a logic designer uses a logic design system to design a desired custom circuit (user logic 98).

At step 132, a desired packet format (and therefore a desired circuit design for soft memory interface circuit 94A and packet formation logic 96) is specified in the logic design system based on knowledge of which type of memory interface is supported by the external memory that is to be used with programmable integrated circuit 10.

At step 134, user logic 98 and packet formation logic 96 may be programmed in programmable logic integrated circuit 10 by loading configuration data from the logic design system into configuration memory 20. As part of the process of implementing user logic 98 and packet formation logic 96 in programmable logic 18 in this way, information is stored in registers 100 that specifies the correct locations of the sequence number field, ACK field, and CRC field.

Figure 7:
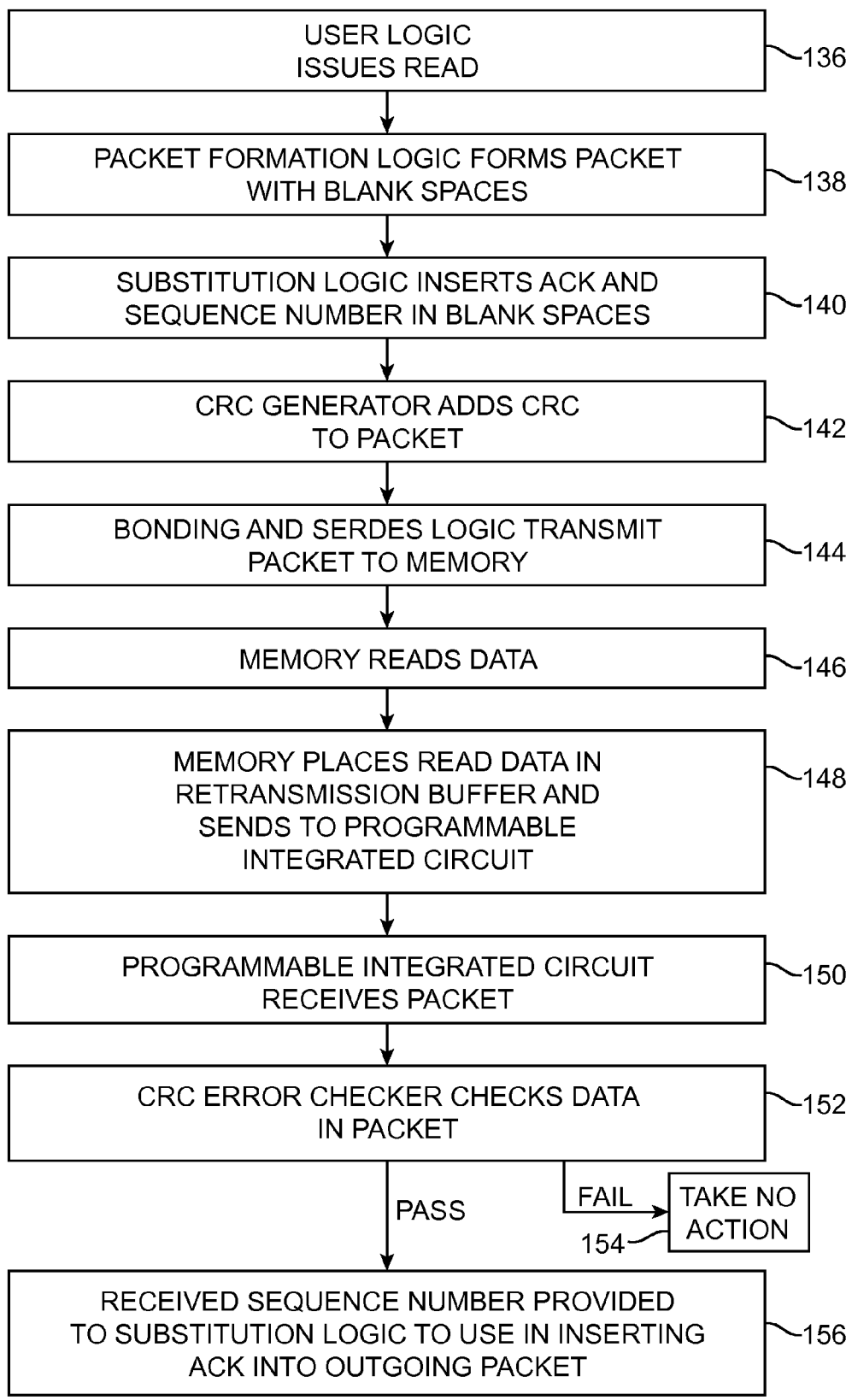
FIG. 7 is a flow chart of illustrative steps involved in using memory interface circuitry in a programmable integrated circuit to handle data packets in accordance with an embodiment of the present invention.

Illustrative steps involved in using programmable integrated circuit 10 in a system following the programming operations of FIG. 6 are shown in FIG. 7.

At step 136, user logic 98 may issue a command (e.g., a write or read request). As an example, user logic 98 may issue a read request that requests data from memory 70.

At step 138, packet formation logic 96 forms an outgoing packet with empty fields for receiving sequence number information, ACK information, and CRC information.

At step 140, substitution logic 108 inserts the sequence number into the empty sequence number field and inserts the ACK into the empty ACK field. Substitution operations are packet processing operations that may be performed rapidly, which helps hardwired memory interface circuitry 94B ensure low latency during acknowledgement processing.

At step 142, CRC generator 114 computes a cyclic redundancy check value (e.g., CRC-32 or CRC-16) and adds the CRC value to the outgoing packet in the empty CRC field.

At step 144, bonding circuit 116 and SERDES circuit 112 transmit the packet to memory 70 over serial path 72.

At step 146, memory 70 receives the transmitted packet and performs the requested read operation (i.e., memory 70 reads the requested data form its internal memory circuits).

At step 148, memory 70 places the data that has been read into its retransmission buffer and sends the data in a packet to programmable integrated circuit 10 over path 72.

At step 150, programmable integrated circuit 10 uses SERDES circuit 112 and bonding circuit 110 to receive the packet. Fields from the data packets that are received from the memory can be extracted by the hardwired logic of circuit 10. In extracting fields from the data packets, the hardwired logic may copy the fields. The hardwired logic may process the extracted fields (e.g., CRC information, etc.). Soft logic can process the remaining fields (i.e., the fields of the data packets other than those extracted and processed by the hardwired logic).

Fields that can be extracted include cyclic redundancy check fields, acknowledgement fields, and transmit sequence number fields. The circuits of the hardwired logic can process these extracted fields. For example, after a CRC that has been extracted from a received data packet has been provided to CRC checker 106, CRC checker 106 may compute a CRC for the incoming packet and may compare the computed CRC to the CRC that was included in the packet by the memory (step 152). If the CRC values do not match there is an error. In this situation, programmable integrated circuit 10 may, as an example, take no further action (step 154).

If the CRC values match, the data has been successfully read and an ACK may be sent back to the memory. For example, the sequence number of the received packet may be extracted and provided to the substitution logic for inclusion in the next outgoing packet to the memory. The received packet may then be processed using soft memory interface circuit 94A and user logic 98.

The operations of FIG. 7 may be performed in connection with any suitable memory interface protocol. Consider, as an example, the HMC specification promulgated by the Hybrid Memory Cube consortium.

When communicating with a memory that is compliant with the HMC specification, hardwired logic 10B may be used to insert information into packet fields such as the packet fields of FIG. 8. Information for the TAG field may be maintained using a counter in retransmission buffer 104. Information for the cyclic redundancy field CRC may be generated by CRC generator 114. Information for the SEQ field may be maintained using a counter in retransmission buffer 104. Information for the forward retry pointer FRP may be obtained from an address used in retransmission buffer 104 to address the memory. The return retry pointer RRP may a value extracted from the received packet using sequence number extractor 102.

Hardwired logic 10B inserts this information into the blank spaces in outgoing packets (see, e.g., steps 138, 140, and 142 of FIG. 7). With the HMC protocol, fields FRP, SEQ, and TAG form sequence number information 78 of FIG. 4, field RRP forms ACK information 80 of FIG. 4, and the CRC field forms CRC information 92 of FIG. 4.

FIG. 9 shows an illustrative packet with blank spaces that has been formed by programmable logic 10A at step 138. The fields that are occupied by blank spaces are listed as "empty" in FIG. 9.

Figure 10:
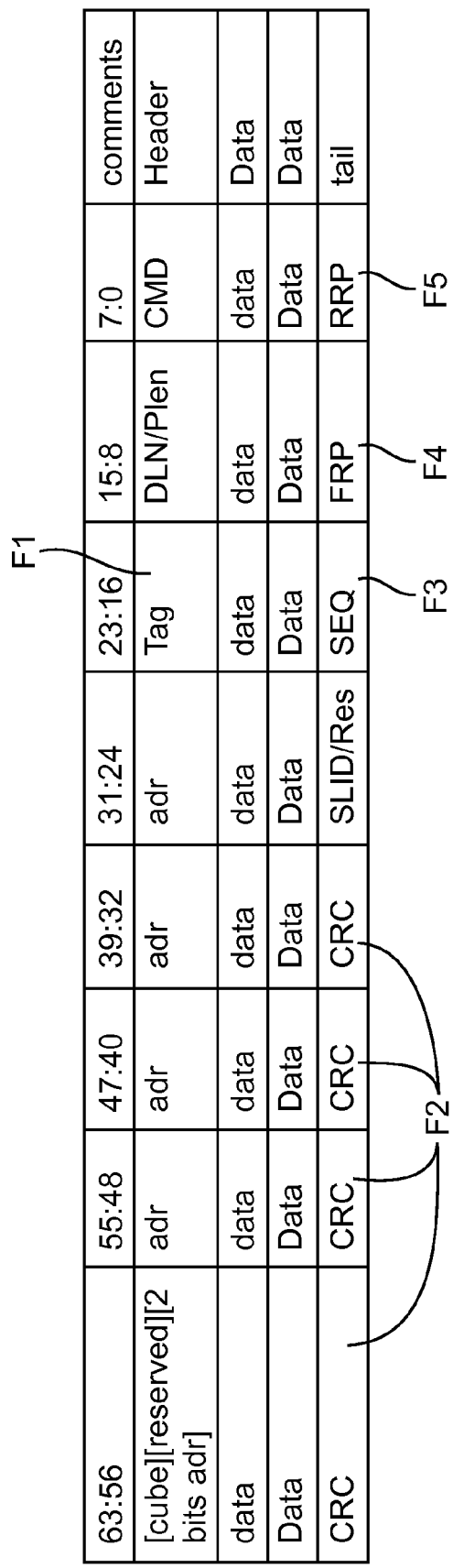
FIG. 10 is a diagram of the illustrative packet of FIG. 9 following insertion of acknowledgement, sequence number, and cyclic redundancy check information into the blank spaces by hard logic in accordance with an embodiment of the present invention.

During the operations of steps 140 and 142 (FIG. 7), hardwired logic 10B fills the empty fields of the packet with information 78, 80, and 92, as shown in the illustrative packet of FIG. 10. As shown in FIG. 10, TAG data has been placed in field F1, CRC data has been placed in fields F2, SEQ data has been placed in field F3, FRP data has been placed in field F4, and RRP data has been placed in field F5.

The example of FIGS. 8, 9, and 10 is associated with the HMC specification. In general, the creation of packets with empty fields by programmable logic 10A and the insertion of appropriate information into these fields by hardwired logic 10B may be performed in connection with any suitable protocol.

The foregoing is merely illustrative of the principles of this invention and various modifications can be made by those skilled in the art without departing from the scope and spirit of the invention.

What is claimed is:

1. A programmable integrated circuit that communicates with an external memory over a serial communications path, the programmable integrated circuit comprising:
   user logic formed from programmable logic on the programmable integrated circuit; and
   memory interface circuitry that serves as an interface between the user logic and the serial communications path, wherein the memory interface circuitry includes a soft memory interface circuit formed from the programmable logic and a hardwired memory interface circuit having at least one predefined function.

2. The programmable integrated circuit defined in claim 1 wherein the soft memory interface circuit includes a packet formation circuit that forms outgoing packets with empty fields.

3. The programmable integrated circuit defined in claim 2 wherein the hardwired memory interface circuit includes substitution logic that inserts information into the empty fields.

4. The programmable integrated circuit defined in claim 3 wherein the substitution logic substitutes information into the empty fields that is selected from the group consisting of: sequence number information, cyclic redundancy check information, and acknowledgement information.

5. The programmable integrated circuit defined in claim 3 wherein the empty fields include an empty sequence number field and wherein the substitution logic substitutes a sequence number into the empty sequence number field based on sequence number information.

6. The programmable integrated circuit defined in claim 5 wherein the hardwired memory interface circuit includes a retransmission buffer that provides the sequence number information to the substitution logic.

7. The programmable integrated circuit defined in claim 3 wherein the empty fields include an empty acknowledgement field, wherein the hardwired memory interface circuitry includes a sequence number extractor that extracts sequence number information from incoming packets from the external memory and that provides a received sequence number to the substitution logic, wherein the substitution logic uses the received sequence number to substitute an acknowledgment into the empty acknowledgment field, wherein the empty fields include an empty cyclic redundancy check field, wherein the hardwired memory interface circuit includes a cyclic redundancy check generator that inserts a cyclic redundancy check value into the empty cyclic redundancy check field, wherein the programmable integrated circuit further comprises registers that store information on locations for the empty fields within the outgoing packets, wherein the sequence number extractor provides received acknowledgement information to the retransmission buffer, and wherein the retransmission buffer is configured to clear stored packets based on the received acknowledgement information.

8. The programmable integrated circuit defined in claim 1 wherein the hardwired memory interface circuitry includes lane bonding circuitry and serializer-deserializer circuitry coupled to the serial communications path.

9. The programmable integrated circuit defined in claim 1 wherein the hardwired memory interface circuit has a plurality of predefined functions, the programmable integrated circuit further comprising circuitry that supplies at least one control signal to the hardwired circuitry to select a given predefined function from the plurality of predefined functions.

10. Memory interface circuitry that serves as an interface between a logic circuit and a memory that is coupled to the memory interface by a serial communications path, comprising:
    packet formation logic formed from programmable logic, wherein the packet formation logic forms data packets with empty fields;
    a hardwired substitution logic circuit that inserts information into the empty fields; and
    hardwired logic that extracts information from at least one field in data packets received from the memory.

11. The memory interface circuitry defined in claim 10 wherein the information that is extracted by the hardwired logic includes information selected from the group consisting of: a cyclic redundancy check, an acknowledgement, and a sequence number.

12. The memory interface circuitry defined in claim 11 wherein the information extracted by the hardwired logic is the acknowledgement.

13. The memory interface circuitry defined in claim 11 wherein the information extracted by the hardwired logic is the sequence number.

14. The memory interface circuitry defined in claim 11 wherein the information extracted by the hardwired logic is the cyclic redundancy check.

15. The memory interface circuitry defined in claim 14 further comprising a hardwired cyclic redundancy checker circuit that performs cyclic redundancy checking on the cyclic redundancy check extracted from the data packets received from the memory.

16. The memory interface circuitry defined in claim 10 further comprising a hardwired cyclic redundancy checker circuit that provides the packets received from the memory to a sequence number extractor and is configured to assert a flag to inform the sequence number extractor when received packets are free of errors.

17. The memory interface circuitry defined in claim 10 further comprising registers that provide the hardwired substitution logic circuit with information identifying where the empty fields are located within the packets.

18. A method of processing packets with a memory interface circuit on a programmable integrated circuit that is coupled to an external memory over a serial communications path, the method comprising:
    with packet formation logic in the memory interface circuit that is implemented in programmable logic, forming outgoing packets for the external memory that include empty fields; and
    with a hardwired logic circuit in the memory interface circuit, inserting information in one of the empty fields, wherein the information is selected from the group consisting of: a packet acknowledgement, a sequence number, and a cyclic redundancy check.

19. The method defined in claim 18 further comprising:
    with a hardwired sequence number extractor, extracting sequence numbers from packets received from the external memory and providing the extracted sequence numbers to the hardwired logic circuit.

20. A method of processing packets with a memory interface circuit on a programmable integrated circuit that is coupled to an external memory over a serial communications path, the method comprising:
    with packet formation logic in the memory interface circuit that is implemented in programmable logic, forming outgoing packets for the external memory that include empty fields; and
    with a hardwired logic circuit in the memory interface circuit, inserting information into the empty fields.

21. The method defined in claim 20 wherein inserting the information comprises inserting packet acknowledgement information.

22. The method defined in claim 21 wherein inserting the acknowledgement information comprises inserting a return retry pointer.

23. The method defined in claim 20 wherein inserting the information comprises inserting sequence number information.

24. The method defined in claim 23 wherein inserting the sequence number information comprises inserting a forward retry pointer, a sequence number, and a tag field.

25. The method defined in claim 20 wherein inserting the information comprises inserting cyclic redundancy check information.

* * * * *